US009946668B1

(12) United States Patent
Galijasevic et al.

(10) Patent No.: US 9,946,668 B1
(45) Date of Patent: Apr. 17, 2018

(54) AUTOMATIC PRIORITIZATION OF INTERRUPTS IN A MODELING ENVIRONMENT

(71) Applicant: The MathWorks, Inc., Natick, MI (US)

(72) Inventors: Zijad Galijasevic, Shrewsbury, MA (US); Antonin Ancelle, Bangalore (IN); Murat Belge, Westford, MA (US)

(73) Assignee: The MathWorks, Inc., Natick, MA (US)

( * ) Notice: Subject to any disclaimer, the term of this patent is extended or adjusted under 35 U.S.C. 154(b) by 374 days.

(21) Appl. No.: 14/286,359

(22) Filed: May 23, 2014

Related U.S. Application Data

(63) Continuation of application No. 11/652,171, filed on Jan. 10, 2007, now abandoned.

(51) Int. Cl.
*G06F 13/26* (2006.01)

(52) U.S. Cl.
CPC ................. *G06F 13/26* (2013.01)

(58) Field of Classification Search
CPC ................. G06F 13/24; G06F 13/26
USPC ............... 710/261, 264, 265, 269; 718/100; 717/109
See application file for complete search history.

(56) References Cited

U.S. PATENT DOCUMENTS

| 4,145,735 | A | * | 3/1979 | Soga ............................. 710/264 |
| 4,796,179 | A | * | 1/1989 | Lehman et al. ................ 700/86 |
| 5,392,033 | A | * | 2/1995 | Oman et al. .................. 710/107 |
| 5,680,624 | A | | 10/1997 | Ross |
| 6,081,867 | A | * | 6/2000 | Cox ............................. 710/264 |
| 6,298,410 | B1 | * | 10/2001 | Jayakumar et al. .......... 710/266 |
| 6,934,947 | B1 | * | 8/2005 | Zeidman ....................... 718/100 |
| 7,111,089 | B2 | * | 9/2006 | Karam et al. .................. 710/48 |
| 7,120,718 | B2 | * | 10/2006 | Pezzini ......................... 710/265 |
| 7,219,328 | B2 | * | 5/2007 | Schloegel et al. ............ 717/104 |
| 7,305,588 | B2 | * | 12/2007 | Athanassiadis ................ 714/34 |
| 8,424,013 | B1 | * | 4/2013 | Chalmer ................ G06F 9/461 712/244 |
| 2001/0047470 | A1 | * | 11/2001 | Roche ..................... G06F 13/26 712/244 |
| 2002/0184423 | A1 | * | 12/2002 | Khan ...................... G06F 13/26 710/260 |
| 2004/0049621 | A1 | * | 3/2004 | Singh .................... G06F 9/4812 710/260 |
| 2005/0155014 | A1 | | 7/2005 | Andrade et al. |
| 2005/0216248 | A1 | | 9/2005 | Ciolfi et al. |
| 2006/0041860 | A1 | | 2/2006 | Carmichael et al. |
| 2007/0136729 | A1 | * | 6/2007 | Neuman ............... G06F 9/4887 718/102 |

* cited by examiner

*Primary Examiner* — Tim T Vo
*Assistant Examiner* — Phong H Dang
(74) *Attorney, Agent, or Firm* — Harrity & Harrity, LLP

(57) ABSTRACT

In one embodiment, a method of implementing interrupt prioritization and preemption in a modeling environment is provided. The method may include obtaining a model including interrupt-generating components in the modeling environment, obtaining information describing interrupts in the model, and using the information describing the interrupts in the model to automatically generate code for prioritizing the interrupts in the modeling environment.

24 Claims, 11 Drawing Sheets

AUTOMATIC PRIORITIZATION OF INTERRUPTS IN A MODELING ENVIRONMENT

CROSS-REFERENCE TO RELATED APPLICATIONS

This application is a continuation application of U.S. patent application Ser. No. 11/652,171 filed on Jan. 10, 2007, the entire contents of which are incorporated herein by reference.

BACKGROUND

Graphical models facilitate the modeling of systems such as, for example, real-world systems, for engineering and scientific purposes. A graphical model of a system may represent time-dependent or event-dependent mathematical relationships among the system's inputs, states and outputs. System designers can use graphical models to mathematically model the behavior of a physical system. Challenges in the development of systems involve correctly implementing requirements and specifications created by the system designer. These specifications are often delivered to systems and software engineers in the form of written documents, flow charts, and sample code that must then be manually implemented in the embedded system. Graphical model-based design intends to support everyone working from the same models in real time, avoiding time-consuming, manual coding tasks and reducing the potential for errors.

Graphical models can be configured and prepared for code generation. Code can be automatically generated from a graphical model for prototype hardware to allow real-time implementation of a system. One use of graphical models capable of automatic code generation is in the design of embedded systems. Embedded system designers can implement a graphical model to operate in real time using automatically-generated code for testing, prototyping and optimization before deployment in the embedded systems. Graphical models capable of automatic code generation thus may reduce development time and costs by enabling the embedded system designers to run real-time simulations with hardware-in-the-loop systems, rapidly prototype ideas on real systems and generate production C code from models.

SUMMARY

In one embodiment, a computer-implemented method of implementing interrupt prioritization in a modeling environment is provided. The method may include obtaining information describing interrupts generated by interrupt-generating components in a model, and using the information describing the interrupts to automatically generate code for prioritizing interrupts in the model on a target.

In another embodiment, a computer-implemented method of implementing asynchronous interrupt prioritization in a block diagram modeling environment is provided. The method may include obtaining information describing asynchronous interrupts in a block diagram model, wherein the information comprises priorities of the asynchronous interrupts, and using the information describing the asynchronous interrupts in the block diagram model to automatically generate interrupt service routines for prioritizing the asynchronous interrupts in the block diagram model on a target.

In another embodiment, a system for implementing interrupt prioritization in a modeling environment is provided. The system may include a modeling environment to execute a model including a plurality of modeling components, wherein the modeling environment includes a mechanism to obtain information describing interrupts in the model, and an automatic interrupt prioritization code generator to use the information describing interrupts to automatically generate code for prioritizing the interrupts in the model on a target.

In another embodiment, a medium storing executable instructions for causing a computing device to implement interrupt prioritization in a modeling environment is provided. The instructions may include instructions for obtaining information describing interrupts generated by interrupt-generating components in a model, and instructions for using the information describing the interrupts to automatically generate code for prioritizing interrupts in the model on a target.

In another embodiment, a medium storing executable instructions for causing a computing device to implement asynchronous interrupt prioritization in a block diagram modeling environment is provided. The instructions may include instructions for obtaining information describing asynchronous interrupts generated by blocks in a block diagram model, wherein the information comprises priorities of the asynchronous interrupts. The instructions may also include instructions for using the information describing the asynchronous interrupts to automatically generate interrupt service routines for prioritization asynchronous interrupts in the block diagram model on a target.

In still another embodiment, a system for implementing interrupt prioritization in a modeling environment is provided. The system may include means for obtaining information describing interrupts generated by interrupt-generating components in a model. The system may also include means for using the information describing the interrupts to automatically generate code for prioritizing interrupts in the model on a target.

BRIEF DESCRIPTION OF THE DRAWINGS

The accompanying drawings, which are incorporated in and constitute a part of this specification, illustrate one or more embodiments of the implementation and, together with the description, explain the implementation. In the drawings.

DETAILED DESCRIPTION

Figure 1:
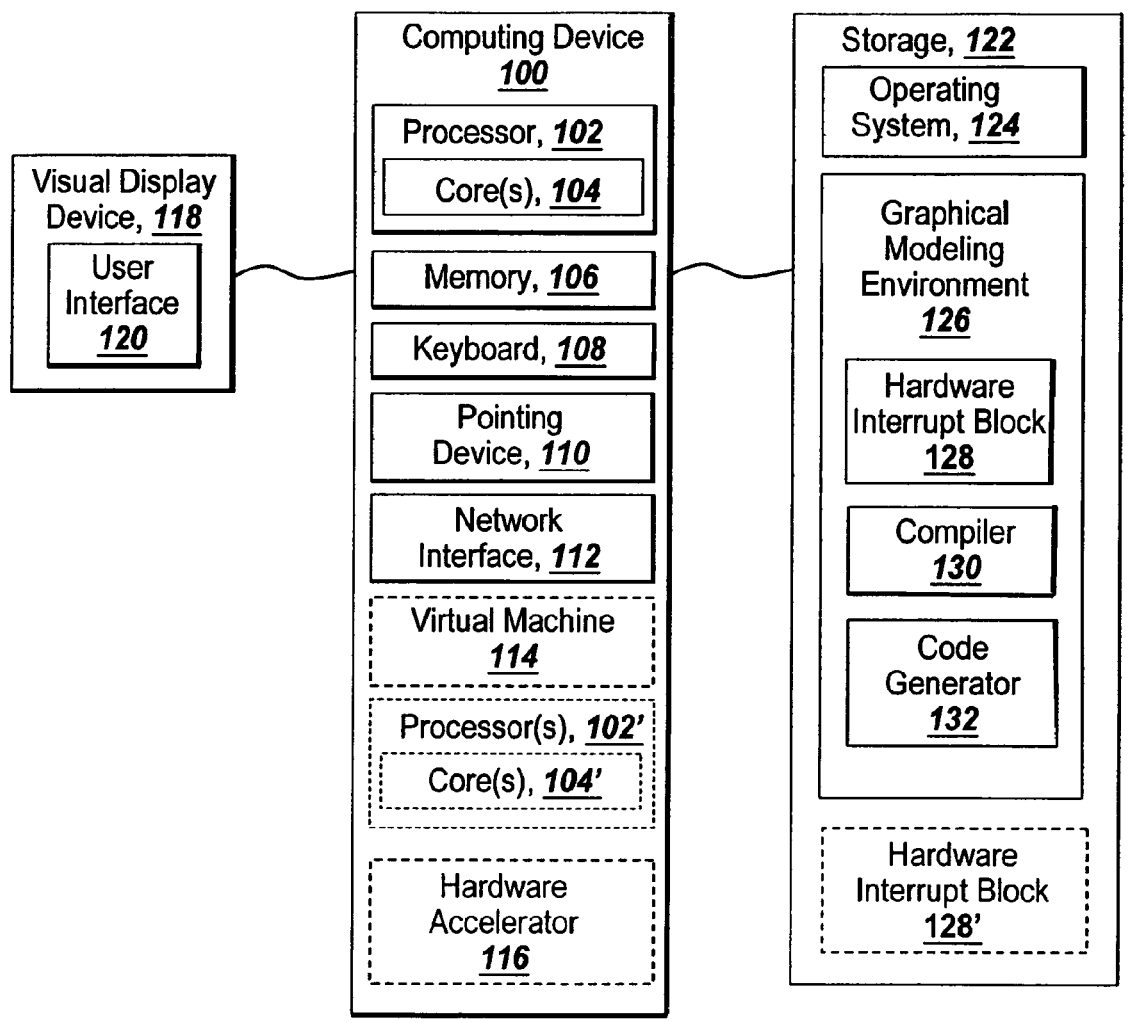
FIG. 1 is a block diagram of a computing device suitable for practicing exemplary embodiments.

Exemplary embodiments are directed to implementing an interrupt prioritization and/or preemption scheme in a modeling environment. Exemplary embodiments obtain a model built in the modeling environment that includes components that generate synchronous and/or asynchronous interrupts. In one embodiment, asynchronous interrupts are generated by hardware and synchronous interrupts are generated by software. Embodiments provide an element in the model for specifying an interrupt prioritization and preemption scheme and implement the desired prioritization and preemption scheme for simulation of the model. One embodiment is used in real-time simulation.

In the simulation of a typical graphical model one deals with multiple sources of asynchronous and synchronous interrupts that are each assigned to a specific task function. Code automatically generated from such a graphical model may be run on a target that does not support full interrupt features or a target that does not support a desirable prioritization and/or preemption scheme. Exemplary embodiments may allow automatic code generation for a prioritization and/or preemption scheme suitable for simulation of graphical models.

Interrupts are a commonly used technique for computer multitasking, especially in real-time computing. An interrupt may be asynchronous or synchronous. Asynchronous interrupts avoid expending processor time in polling loops and in waiting for external events: an asynchronous interrupt signals the processor when an asynchronous event occurs, allowing the processor to process other work while the event is pending.

One example application is with modeling for use on a target that does not support asynchronous interrupt prioritization and preemption. With modeling, especially for obtaining real-time models, asynchronous interrupts may need to be prioritized, i.e. task functions associated with asynchronous interrupts need to be assigned priorities of execution based on application requirements. Simulation of an application may require assigning high priorities to task functions associated with certain asynchronous interrupt events, and low priorities to task functions associated with certain other asynchronous interrupt events. However, current graphical models such as, for example, block diagram models, do not generate code for models that implement asynchronous interrupt prioritization, i.e. there is no priority-based interrupt preemption scheme implemented in software. An example of a processor that runs block diagram models that do not implement asynchronous interrupt prioritization is the TI C6000 processor which has 16 interrupts, but in which priority rules for an interrupt preempting another interrupt are not implemented. A second example is the TI C2000 processor which has 256 interrupts, in which priority rules for an interrupt preempting another interrupt are not implemented.

As a result, asynchronous schedulers cannot be truly implemented in the aforementioned types of systems without using interrupt prioritization implemented in software. Even the use of a real-time operating system (RTOS), e.g. the real-time kernel Digital Signal Processing/Basic Input Output System (DSP/BIOS), is unable to overcome this limitation. RTOS is a class of operating systems intended for real-time applications that have found common use in embedded systems (e.g. programmable thermostats, household appliance controllers, mobile telephones). An RTOS facilitates the creation of a real-time system; however, achieving real-time operation requires interrupt prioritization implemented in software.

One approach in ensuring the real-time nature of simulation in a modeling environment is to dynamically adjust asynchronous interrupt handling so that interrupt handling reflects the priorities assigned to each interrupt source in the model. This technique of dynamic asynchronous interrupt prioritization must be achieved by software means. Implementation of asynchronous interrupt prioritization in software suited to the target is only one application of the present implementation. Further, hardware interrupt prioritization implemented in embodiments may be achieved by software schemes not supported by the target.

Exemplary embodiments are described below for illustrative purposes relative to a SIMULINK-like or SIMULINK-compatible modeling environment that enables a graphical model to be built and/or executed. A SIMULINK-compatible modeling environment provides means to use a SIMULINK model and/or features in the SIMULINK modeling environment. For example, a SIMULINK-compatible modeling environment may provide means to interface with a SIMULINK model, importing or exporting a SIMULINK model, translating a SIMULINK model, or integrating a SIMULINK model.

Although the exemplary embodiments are described relative to a SIMULINK-compatible modeling environment, the present implementation is not limited to these embodiments and may be applied to graphical modeling and/or computing tasks via other graphical modeling environments. Some possible examples of suitable graphical modeling environments that may be used to develop and/or execute a graphical model in accordance with exemplary embodiments are, but are not limited to, Stateflow® software from the MathWorks Inc., LabVIEW® or MATRIXx® from National Instruments, Inc., Dymola from Dynasim AB of Lund, Sweden, Extend from Imagine That, Inc. of San Jose, Calif., Le Chesnay Cedex, France, MSC.Adams® from MSC.Software Corporation of Santa Ana, Calif., etc. Modeling environments, such as those that support modeling physics-based domains, Unified Modeling Language (UML) like Rhapsody® from iLogix, Inc. of Toronto, Canada or Rational® from International Business Machines Corporation of Armonk, N.Y., or SysML like ARTiSAN Studio from ARTiSAN Software Tools, Inc of Beaverton, Oreg. or Rhapsody® from iLogix, Inc., etc., may be suitable for implementing a graphical model in accordance with the exemplary embodiments. Exemplary embodiments may also be used in a text-based environment, such as a text-based modeling and/or text-based programming environment. Embodiments may be applied to text-based environments such as Mathematica® from Wolfram Research, Inc., Maple™ from Maplesoft, Scilab™ from The French National Institution for Research in Computer Science and Control (INRIA), MATLAB from The MathWorks, Inc.

FIG. 1 depicts a computing device 100 suitable for practicing an exemplary embodiment of the present implementation. Computing device 100 may include memory 106, on which software according to one embodiment may be stored, processor 102, and optionally, one or more processor(s) 102' for executing software stored in the memory 106, and other programs for controlling system hardware. Processor 102 and processor(s) 102' may each be a single core or multiple core (104 and 104') processor.

Memory 106 may include a computer system memory or random access memory such as dynamic random access memory (DRAM), static random access memory (SRAM), magnetoresistive random access memory (MRAM), extended data out random access memory (EDO RAM), flash memory, etc. A user may interact with the computing device 100 through a keyboard 108, a pointing device 110, and/or a visual display device 118 such as a computer monitor, which may include a user interface 120. The computing device 100 may include other I/O devices, for example a mouse, a motion based input device, and a camera, for receiving input from a user. The computing device 100 may further include a storage device 122, such as a hard-drive, CD-ROM, or other computer readable medium, for storing an operating system 124 and other related software, and for storing graphical modeling environment 126, such as a SIMULINK modeling environment. Graphical modeling environment 126 may be used to create, edit, and/or execute a graphical model. Graphical modeling environment 126 may include a compiler 130 that compiles the graphical model. Graphical modeling environment 126 may also include a code generator 132 that can be used to generate code from a graphical model for executing on a target system. Graphical modeling environment 126 may further include a hardware interrupt block 128 that implements automatic prioritization of asynchronous interrupts in a block diagram model. One of ordinary skill in the art will appreciate that hardware interrupt block 128 may be adapted to be included as part of graphical modeling environment 126 or code generator 132, or it can be a stand-alone application, module, script, or program that responds to calls from graphical modeling environment 126, such as hardware interrupt block 128'.

Additionally, the computing device 100 may include a network interface 112 to interface to a Local Area Network (LAN), Controller Area Network (CAN), Body Area Network (BAN), Wide Area Network (WAN) or the Internet through a variety of connections including, but not limited to, standard telephone lines, LAN or WAN links (e.g., IEEE 802.11, IEEE 802.16, T1, T3, 56kb, X.25), broadband connections (e.g., Integrated Services Digital Network (ISDN), Frame Relay, asynchronous transfer mode (ATM)), wireless connections, or some combination of any or all of the above. The network interface 112 may include a built-in network adapter, network interface card, Personal Computer Memory Card International Association (PCMCIA) network card, Card Bus network adapter, wireless network adapter, Universal Serial Bus (USB) network adapter, modem or any other device suitable for interfacing the computing device 100 to any type of network capable of communication and performing the operations described herein. Moreover, the computing device 100 may be any computer system such as a workstation, desktop computer, server, laptop, handheld computer or other form of computing or telecommunications device that is capable of communication and that has sufficient processor power and memory capacity to perform the operations described herein, e.g. a platform for automotive systems conforming to AUTOSAR, FireWire, a FlexRay-compliant device, etc.

The computing device 100 may be running substantially any operating system such as a version of the Microsoft® Windows® operating systems, Unix operating system, Linux operating systems, MacOS® operating system, etc. Implementations of computing device 100 may further operate an embedded operating system, a real-time operating system, an open source operating system, a proprietary operating system, an operating system for mobile computing devices, and/or another type of operating system capable of running on computing device 100 and performing the operations described herein.

Virtualization may be employed in computing device 100, for example, to dynamically share infrastructure and resources in the computing device may be shared dynamically. Virtualized processors may be used with graphical modeling environment 126 and other software in storage 122. A virtual machine 114 may be provided to handle a process running on multiple processors so that the process appears to be using only one computing resource rather than multiple. Multiple virtual machines may also be used with one processor. Other computing resources, such as Field Programming Gate Array (FPGA), Application Specific Integrated Circuit (ASIC), Application Specific Instruction Processor (ASIP), Digital Signal Processor (DSP), Graphics Processing Unit (GPU), and General Purpose Processor (GPP), may also be used for executing code and/or software. A hardware accelerator 116, such as implemented in an ASIC, FPGA, or the like, may additionally be used to speed up the general processing rate of the computing device 100.

In certain applications, it may be desirable to use graphical models to represent a design or algorithm of an implementation for computational hardware. One or more graphical models implemented in a computing device may represent a design for a target system. A target system may include a single hardware component or multiple hardware components. When the model is determined to be satisfactory; an engineer may wish to generate code for a target controller installed in the target system. The computing device containing the model may communicate with the target system through a link that may be any form of a communication path. Some models may allow the engineer to generate code for the target system using the modeling application.

Figure 2:
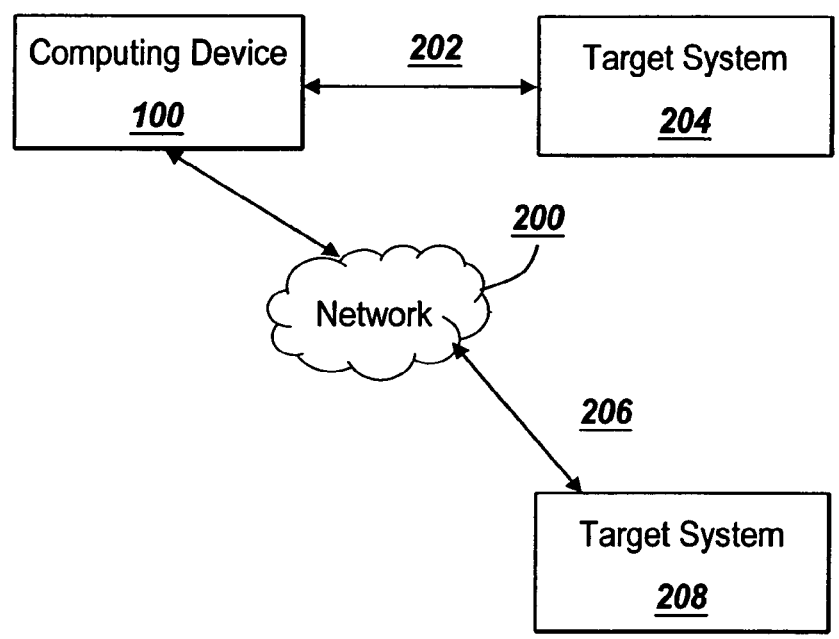
FIG. 2 is a block diagram illustrating how a computing device may communicate with a target system.

FIG. 2 illustrates one example of how computing device 100 may communicate with a target system. Computing device 100 may communicate with target system 204 directly via link 202. Computing device 100 may also communicate with target system 208 via network 200. Network 200 may be, for example, a LAN, WAN, wireless network, or a combination of wired and wireless network. Computing device 100 may obtain information on target system 204 or 208 so that hardware interrupt block 128 may determine hardware interrupt sources in a graphical model employed on target system 204 or 208. Computing device 100 may provide the obtained information to code generator 132. Code generator 132 may use the obtained information to identify a type of generated code to ensure that the generated code can be executed on the target system 204 or 208.

By way of example, the automatic code generation may be performed with Real-Time Workshop® from a graphical model designed using the SIMULINK modeling environment. REAL-TIME WORKSHOP may use target language compiler script files, with a .tlc file extension, as input files to the compilation and code generation process. The .tlc files may provide sections of programming instructions to be implemented for block references as block references may be found in a graphical model during the compilation and code generation process. The .tlc files also may provide data and class definitions for data element references found in the graphical model.

Additionally, the .tlc files also may include compiler directives, built-in functions and other code generation commands to direct REAL-TIME WORKSHOP during the code generation process. SIMULINK creates and stores graphical models into model files with a .mdl file extension. During compilation and as part of the code generation process, REAL-TIME WORKSHOP may read in a .mdl model file and may analyze the model to generate an intermediate model file with an .rtw extension. An intermediate model file with an .rtw extension may also be generated from an in-memory representation of a compiled SIMULINK model. This intermediate .rtw model file may include a hierarchical structure of records. The records may describe systems, blocks in the systems, and connections among the blocks, all analyzed from a block diagram model in the .mdl file. This intermediate .rtw file may preferably be in a language-independent format.

A language compiler called the target language compiler of REAL-TIME WORKSHOP may work with .tlc files and .rtw files to automatically produce code. For example, the target language compiler may interpret a program that reads the intermediate model file description of a .rtw file. As the target language compiler encounters a record in the .rtw file, it may use directives in the .tlc files corresponding to the record to direct the code generation process for the specific record. As such, the target language compiler may work much like a text processor. For example, the target language compiler may use block .tlc files, which specify the particular code for a block, to transform each block into code. When it reads a record in the .rtw file that references a block, the target language compiler may apply code from the corresponding block .tlc file to generate code for the block in source code files. Additionally, model wide .tlc files may also be used to provide input to the target language compiler for global customization of the code. Model wide .tlc files may direct the target language compiler to generate main routines to provide entry points into the program, source code header files to setup data structures, and utility functions to support code for particular blocks. The block and model wide .tlc files may be modified to generate customized code for blocks and to generate any desired global customizations to the code.

The source code files generated from the automatic code generator, such as REAL-TIME WORKSHOP, may include program instructions of a programming language, such as C, which may further be in a format and style following the ANSI/ISO C standard. Additionally, the source code files may be in a programming language other than C that is suitable to employ in a target system. The program instructions of the source code files may be generated to run on any operating system, such as a real-time operation system, or for a specific processor. Further, other types of code generators may be used in embodiments of the present implementation for automatic code generation from graphical models.

One mechanism of implementing asynchronous interrupt prioritization is providing a hardware interrupt block in the modeling environment. A hardware interrupt block may allow asynchronous processing of interrupts according to a desired prioritization and preemption scheme, and may thus ensure real-time response to external events. A user of a block diagram model may configure the associated hardware interrupt block to implement a desired prioritization and preemption scheme. REAL-TIME WORKSHOP may then automatically generate code based on the hardware interrupt block to implement the desired prioritization and preemption scheme.

One embodiment of the present implementation may be illustrated in a block diagram modeling environment. Block diagram modeling environments, such as SIMULINK, allow engineers to build dynamic system models using a block diagram representation. SIMULINK enables a user to build a signal-based model in which blocks in the model are connected through signals that connect output and input of blocks. SIMULINK provides reusable components called library blocks for the creation of block diagram models. SIMULINK also provides a subsystem construct for integrating library blocks and/or other SIMULINK blocks into an encapsulated unit. Embodiments are, however, not limited to a block diagram modeling environment and may be implemented in any modeling environment.

A block diagram model of a dynamic system is represented schematically as a collection of blocks interconnected by lines that represent signals. Each block represents an elemental dynamic system. A signal represents either the input or the output of a dynamic system. A line emanating at one block and terminating at another signifies that the output of the first block is an input to the second block. Signals correspond to the time-varying quantities represented by each line connection and are assumed to have values at each time instant at which the connecting blocks are enabled. The source block of a signal writes to the signal at a given time instant when its functionality is evaluated. The destination blocks of this signal read from the signal when their functionality is being evaluated.

A block diagram model may include blocks representing hardware devices or subsystems that generate asynchronous interrupts. Still other blocks may represent devices or subsystems that generate synchronous interrupts at a base rate.

Figure 3:
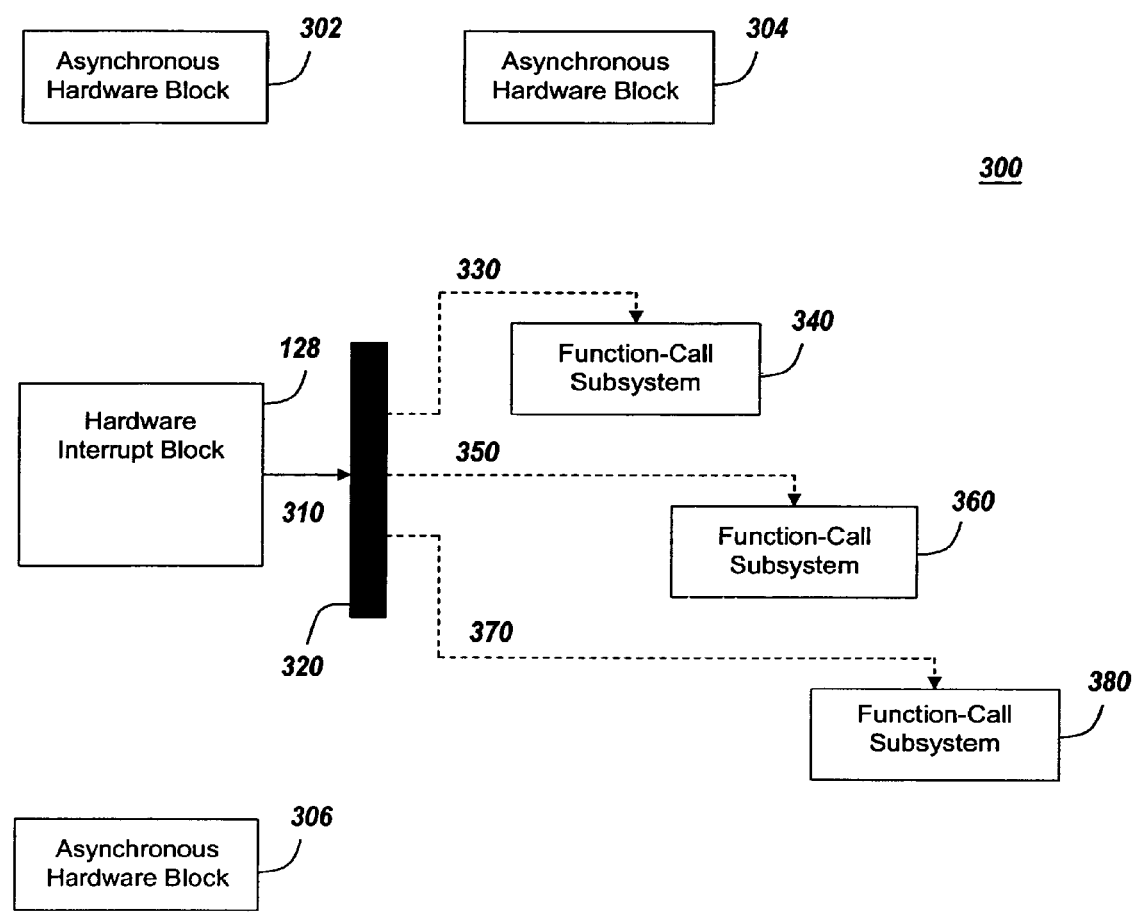
FIG. 3 illustrates an exemplary block diagram model including an exemplary hardware interrupt block and exemplary function-call subsystems.

FIG. 3 illustrates an exemplary block diagram model including an exemplary hardware interrupt block and exemplary task functions. Model 300 is a block diagram model. Block diagram model 300 may contain a single hardware interrupt block 128. Hardware interrupt block 128 may receive asynchronous interrupts configured by other blocks in block diagram model 300. In one embodiment, these asynchronous interrupts may be hardware interrupts. A demux block may extract the components of a vectorized function-call line to output the constituent function-call lines as separate function-call lines. The output of hardware interrupt block 128 may be vectorized function-call line 310 which connects the output port of hardware interrupt block 128 to the input port of demux block 320. The size of function-call line 310 may be the number of asynchronous interrupts hardware interrupt block 128 is configured to handle. The output ports of demux block 320 may be connected to function-call subsystems 340, 360 and 380 by function-call lines 330, 350 and 370, respectively. Function-call subsystems 340, 360 and 380 may contain the blocks that are executed asynchronously in the context of asynchronous interrupts, i.e. the blocks representing task functions. The function-call subsystems may have input and output ports.

Many alterations and modifications may be made by those having ordinary skill in the art without departing from the spirit and scope of the implementation. Other embodiments of the present implementation may include zero or any number of demux blocks, function-call lines and function-call subsystems.

Hardware interrupt block 128 may ensure real-time response to external events by allowing for the asynchronous processing of interrupts triggered by events configured by other blocks in block diagram model 300. In the exemplary embodiment depicted in FIG. 3, hardware interrupt block 128 may react to asynchronous interrupts from three hardware blocks (302, 304 and 306), generate an interrupt service routine (ISR) for asynchronous interrupts from each source, and respond to asynchronous interrupts configured by blocks 302, 304 and 306 by executing their corresponding ISRs. In embodiments, the number of asynchronous blocks may or may not be equal to the number of interrupts.

Hardware interrupt block 128 may be configured by a user to react to asynchronous interrupts from hardware circuits configured by blocks 302, 304 and 306. Upon configuration, hardware interrupt block 128 may automatically generate ISR code for each asynchronous interrupt source. Asynchronous interrupts from blocks 302, 304 and 306 may be serviced by the blocks contained in function-call subsystems 340, 360 and 380, respectively. SIMULINK code generator 132 may generate code for function-call subsystems 340, 360 and 380: task functions 345, 365 and 385, respectively. Asynchronous interrupts from blocks 302, 304 and 306 may be serviced by ISRs executing task functions 345, 365 and 385, respectively, which correspond to function-call subsystems 340, 360 and 380, respectively.

The calls to function-call subsystems may leave hardware interrupt block 128 at its output port as a single vectorized function-call line 310. Function-call line 310 may enter the input port of demux block 320. Demux block 320 may extract the components of function-call line 310 and may output the components as separate function-call lines 330, 350 and 370. Function-call lines 330, 350 and 370 may enter the input ports of function-call subsystems 340, 360 and 380, respectively. Function-call line 330 may lead to the execution of task function 345, corresponding to subsystem 340, in response to asynchronous interrupts from block 302. Function-call line 350 may lead to the execution of task function 365, corresponding to subsystem 360, in response to asynchronous interrupts from block 304. Function-call line 370 may lead to the execution of task function 385, corresponding to subsystem 380, in response to asynchronous interrupts from block 306. In another embodiment, only a single call may be made by hardware interrupt block 128 to a single task function, and function call line 310 may bypass demux block 320 and may directly enter the input port of a function-call subsystem. In yet another embodiment where a single call is made to a single task function, demux block 320 may be absent. Implementation details of the ISRs will be discussed in later sections in connection with FIG. 6.

It should be appreciated that although the examples contained herein are made with reference to block diagram models, the exemplary embodiment of the present implementation may also be applied to other types of models besides block diagrams. It should be noted that the term "block diagram" as used herein may also be used to refer to other modeling formalisms. For instance, flow-charts are block diagrams of entities that are connected by relations. Flow-charts are used to capture process flow and are not generally suitable for describing dynamic system behavior. Data flow block diagrams are diagrams of entities with relations between them that describe a graphical programming paradigm where the availability of data is used to initiate the execution of blocks, where a block represents an operation and a line represents execution dependency describing the direction of data flowing between blocks. It will be appreciated that a block diagram model may include entities that are based on other modeling domains within the block diagram. A common characteristic among these various forms of block diagrams is that they define semantics on how to execute them.

Figure 4A:
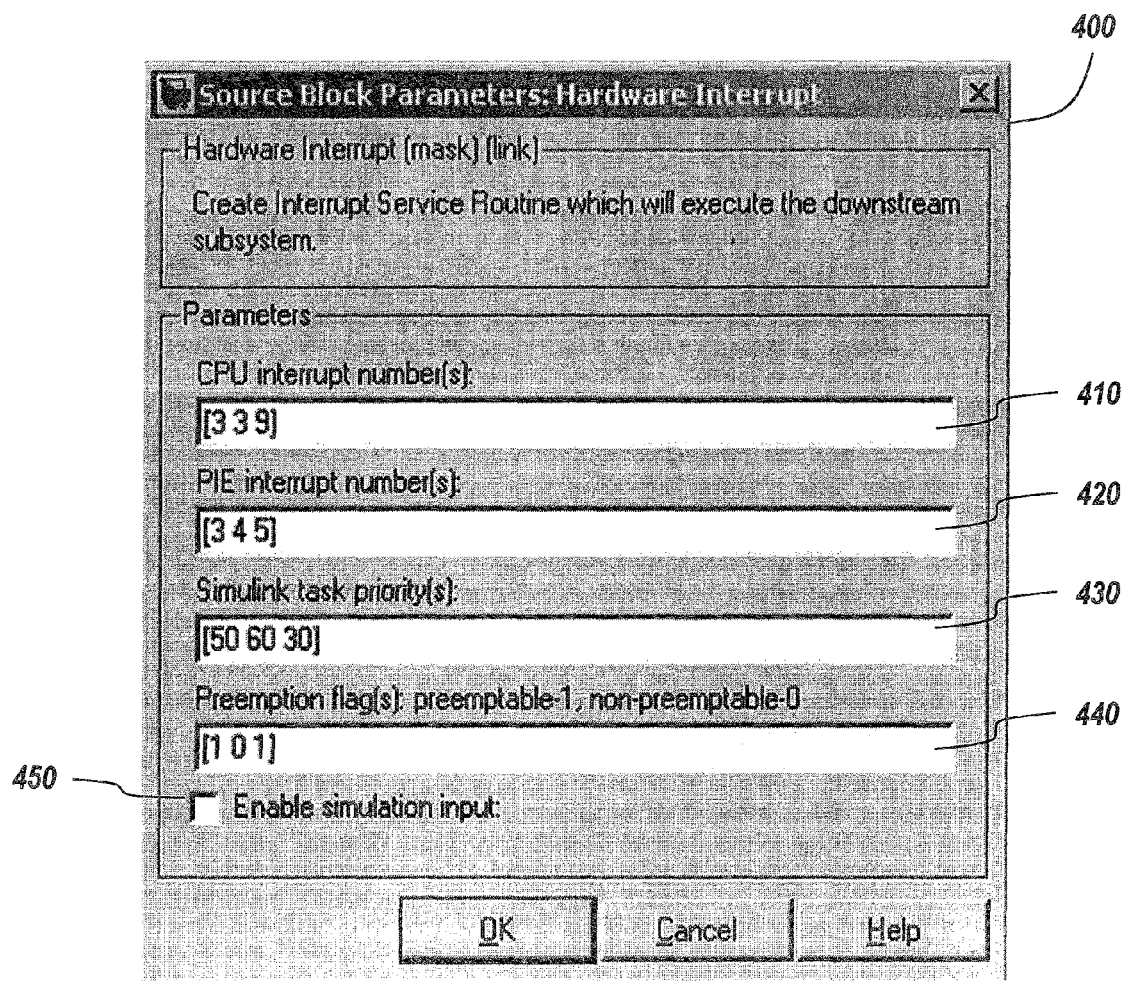
FIG. 4A illustrates an exemplary graphical user interface that may be used by a user to configure an exemplary hardware interrupt block.

FIG. 4A illustrates an exemplary embodiment of a graphical user interface that may be used by a user to configure an exemplary hardware interrupt block. In this embodiment, dialog box 400 may be used to configure hardware interrupt blocks for processors that include a Peripheral Interrupt Expansion (PIE) block that serves to multiplex numerous peripheral interrupt sources into a smaller set of Central Processing Unit (CPU) interrupt inputs. These processors require a PIE interrupt number associated with the source of a hardware interrupt, in addition to a CPU interrupt number. For example, dialog box 400 may be used in configuring hardware interrupt blocks for the C280x family of Texas Instruments chips. For the aforementioned type of processors, an asynchronous interrupt may be set up and represented by a combination of its CPU interrupt number and its corresponding PIE interrupt number.

A CPU interrupt number may be a number representing the source in the CPU of an asynchronous interrupt. A PIE interrupt number may be a number representing the source in a peripheral module of a hardware interrupt. A SIMULINK task priority may be a number representing the task priority of a task performed in response to an associated synchronous or asynchronous interrupt. A preemption flag may specify that an associated interrupt may be preempted by other interrupts, or may specify that an associated interrupt may, not be preempted by other interrupts. An exemplary embodiment of a hardware interrupt block may be configured via dialog box 400 which allows the user to specify CPU interrupt number(s) array 410, PIE interrupt number(s) array 420, SIMULINK task priority array 430, and preemption flag(s) array 440. Dialog box 400 may also allow the user to test asynchronous interrupt processing in the context of the current model (via check-box 450).

An element in CPU interrupt number(s) array 410 may identify the source in the CPU that generates an asynchronous interrupt. An element in PIE interrupt number(s) array 420 may identify the peripheral module that generates the same asynchronous interrupt. Elements at the same index of arrays 410 and 420 may correspond to the same asynchronous interrupt. A CPU interrupt number and a PIE interrupt number together may uniquely specify a single interrupt for a single peripheral or peripheral module.

In an embodiment, an element in SIMULINK task priority(s) array 430 may specify the task priority for an interrupt that is to be processed asynchronously. In another embodiment, dialog box 400 may be used to configure synchronous interrupts in addition to asynchronous interrupts. In an embodiment, a lower task priority numbers may indicate higher priority. In another embodiment, a lower task priority numbers may indicate lower priority. Interrupts may be assigned a fixed task priority according to one embodiment. Task priorities of synchronous interrupts may be variable and configurable by the user according to another embodiment.

In an exemplary embodiment, the implementation may determine the priority of a synchronous or asynchronous interrupt based on its task priority number relative to the task priority numbers of all other synchronous and asynchronous interrupts. In another embodiment, the implementation may use absolute task priority numbers in determining priority of interrupts. In the latter embodiment, each task priority number may have a pre-defined priority, e.g. a task priority number of '40' may denote a very high task priority. In contrast, in the former embodiment, each task priority may have a priority only relative to all other task priorities, i.e. there is no pre-defined priority. In this embodiment, for example, a task priority number of '40' may denote a very low task priority if all other task priorities are very high in comparison, e.g. '1000,' '1050.'

An element in preemption flag(s) array 440 may specify whether a corresponding interrupt is preemptable by, other interrupts. A second interrupt arriving later than a first interrupt, if it is of higher priority, may preempt the first interrupt, in which case execution of the interrupt service routine of the first interrupt is placed on hold to begin execution of the interrupt service routine of the second interrupt. A preemption flag in this implementation, when set to '0,' may indicate that the corresponding interrupt is non-preemptable, thus allowing an important interrupt to execute its interrupt service routines uninterrupted. On the other hand, when set to '1,' a preemption flag may indicate that the corresponding interrupt is preemptable, thus allowing more important later-arriving interrupts to execute their interrupt service routines first. In other embodiments, preemption may be specified by entities other than flags, e.g. by parameters, attributes, etc.

Arrays 410, 420, 430 and 440 in dialog box 400 may have the same dimension, with elements at the same index in the arrays describing the same interrupt. Other embodiments of dialog box 400 may include data structures 410, 420, 430, 440 other than arrays, e.g. unit data structures and matrices, and non-numerical settings for CPU interrupt numbers, PIE interrupt numbers, SIMULINK task priorities and preemption flags.

Figure 4B:
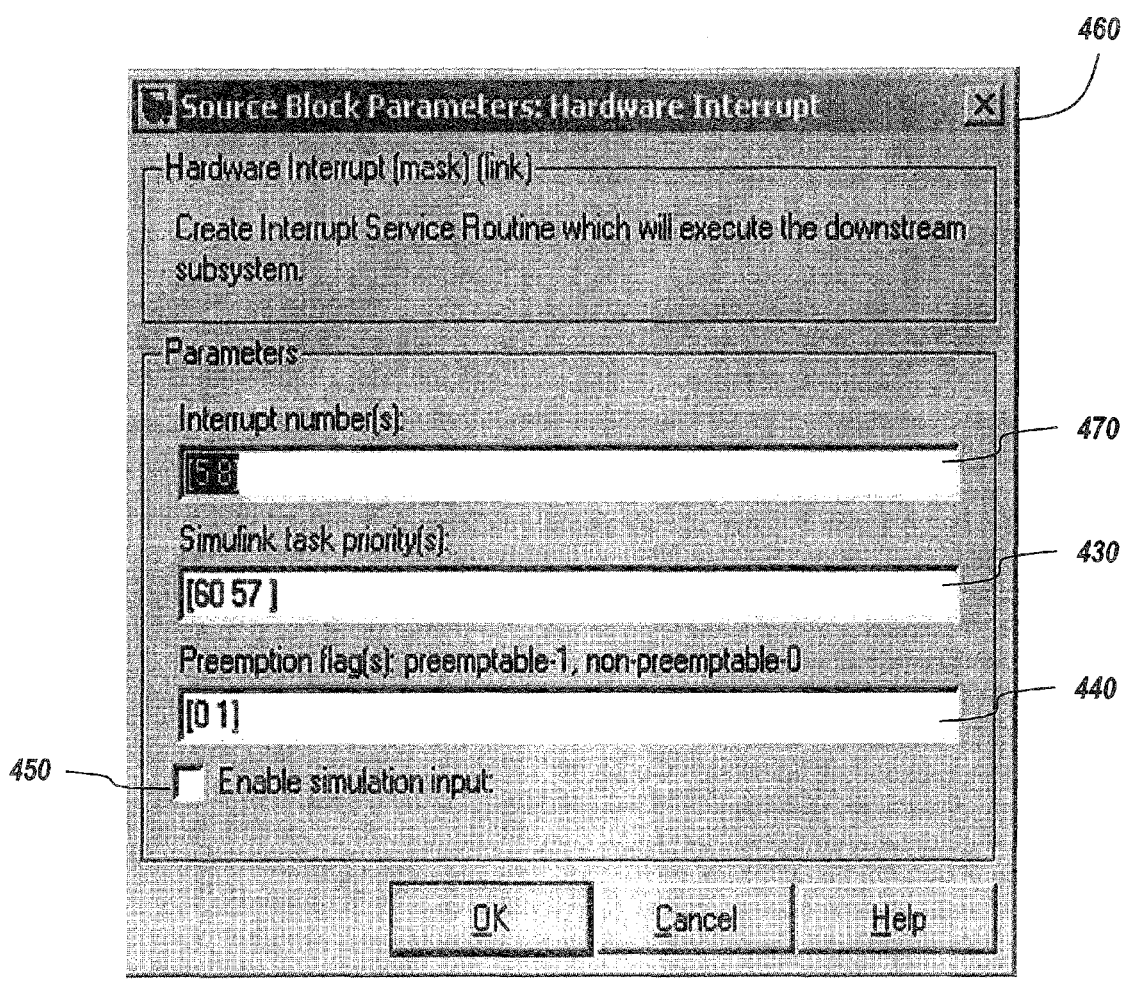
FIG. 4B illustrates another exemplary graphical user interface that may be used by a user to configure an exemplary hardware interrupt block.

FIG. 4B illustrates another exemplary embodiment of a graphical user interface that may be used by a user to configure an exemplary hardware interrupt block. In this embodiment, dialog box 460 may be used to configure hardware interrupt blocks for processors that do not use a Peripheral Interrupt Expansion (PIE) block and therefore do not require a PIE interrupt number associated with the source of an asynchronous interrupt. For example, dialog box 400 may be used in configuring hardware interrupt blocks for the C6xxx family of Texas Instruments chips. For the aforementioned type of processors, an asynchronous interrupt may be set up and represented only by its interrupt number.

An exemplary embodiment of a hardware interrupt block may be configured via dialog box 460 which allows the user to specify interrupt number(s) array 470, SIMULINK task priority(s) array 430 and preemption flag(s) array 440. Dialog box 460 may also allow the user to test asynchronous interrupt processing in the context of the current model (via check-box 450).

The foregoing discussion on 430, 440 and 450 and the general disclosure on dialog box 400, set forth above in connection with FIG. 4A, also apply to the exemplary embodiment of the graphical user interface illustrated in FIG. 4B. Those of skill in the art will understand that dialog boxes 400 and 460 are only exemplary and may include more or fewer fields than those described with reference to FIG. 4A and FIG. 4B. Alternatively, configuration of the hardware interrupt block may be performed by the user with the use of an XML file, a textual user interface, a command-line interface, an Application Programming Interface (API), etc.

Figure 5:
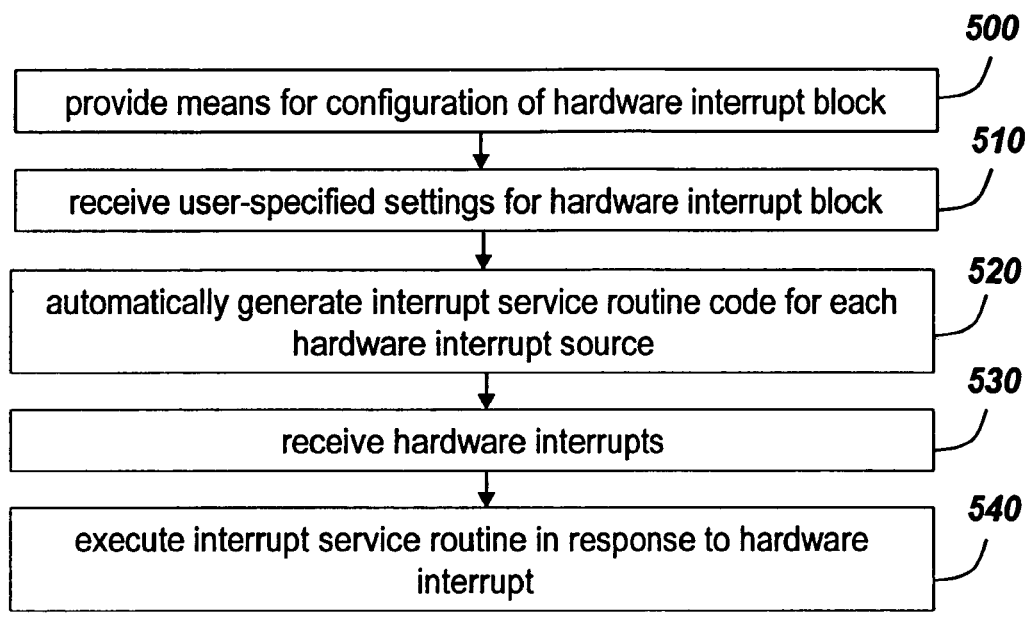
FIG. 5 illustrates a flowchart depicting steps taken by a hardware interrupt block.

FIG. 5 illustrates a flowchart depicting steps taken to practice an exemplary embodiment of hardware interrupt block 128. In step 500, upon its creation, hardware interrupt block 128 may provide the user with means to configure asynchronous interrupts that are to be handled by hardware interrupt block 128. The user may right-click hardware interrupt block 128 to be presented with a dialog box for configuring the hardware interrupt block. Alternatively, the user may be automatically presented with the dialog box upon creating hardware interrupt block 128 and may be prompted to enter parameter values in the dialog box. The user may also select a menu-item in order to be presented with the dialog box for configuring hardware interrupt block 128. Embodiments are not limited to the aforementioned mechanisms of presenting the user with a graphical user interface for configuring the hardware interrupt block. Exemplary embodiments of the graphical user interface that may be used for configuration are illustrated in FIG. 4A and FIG. 4B.

In step 510, hardware interrupt block 128 may receive, for example, the following specifications from the user in an exemplary embodiment consistent with FIG. 4A: an array of CPU interrupt numbers, an array of PIE interrupt numbers, an array of SIMULINK task priorities and an array of preemption flags, as was discussed above. In another embodiment consistent with FIG. 4B, hardware interrupt block 128 may receive the following specifications from the user: an array of interrupt numbers, an array of SIMULINK task priorities and an array of preemption flags. In addition, enable simulation input checkbox 450 may be selected or deselected by the user, its selection denoting that the user wishes to test asynchronous interrupt processing in the context of the SIMULINK model. The above specifications regarding interrupts in the model may be dynamically adjustable during simulation or execution of the model.

In step 520, hardware interrupt block 128 may generate an interrupt service routine (ISR) for each asynchronous interrupt specified by the user in the aforementioned graphical user interface. An interrupt service routine is a subroutine executed in response to the reception of its associated interrupt that may take no arguments and return no value, and may mediate the interaction of a hardware device with a real-time application. Implementation details of an exemplary interrupt service routine will be discussed in connection with FIG. 6 below.

In step 530, during simulation of block diagram model 300, hardware interrupt block 128 may listen for and receive asynchronous interrupts configured in step 520. In an exemplary embodiment, asynchronous interrupts may be signals triggered by events managed by blocks in the block diagram model. In this embodiment, asynchronous interrupts may be generated for asynchronous processing by blocks like analog-to-digital converter blocks, digital-to-analog converter blocks, timer blocks, Controller Area Network (eCAN) receive blocks, etc. Upon reception of an asynchronous interrupt, in step 540, hardware interrupt block 128 may execute the interrupt service routine corresponding to the asynchronous interrupt.

Steps 500, 510 and 520, the initial steps illustrated in the flowchart, may be executed before any real-time execution is performed by the block diagram model, and steps 530 and 540 may be executed during real-time execution.

Figure 6:
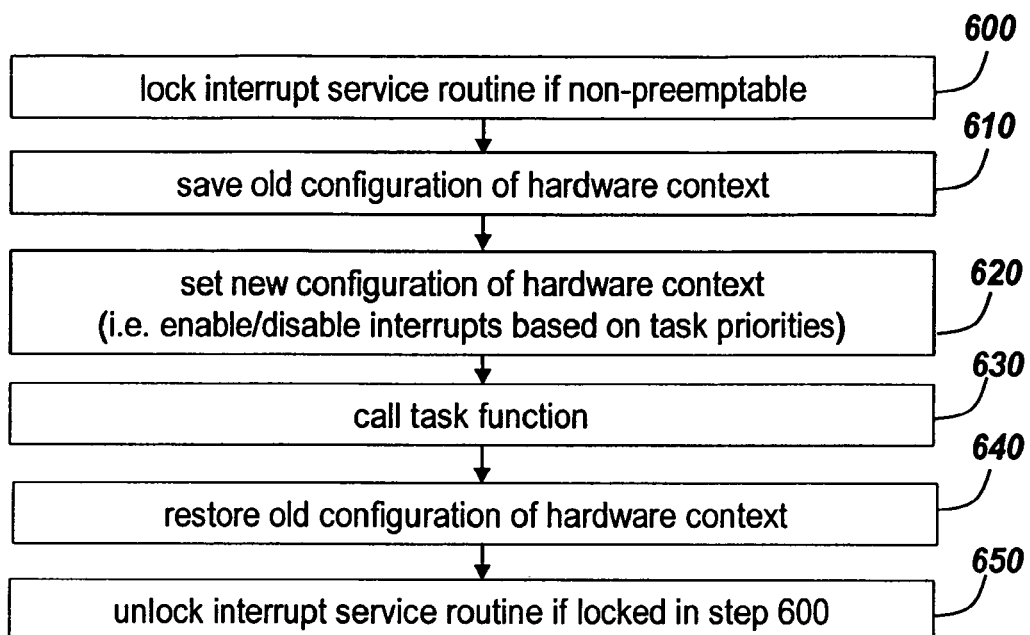
FIG. 6 illustrates a flowchart depicting steps performed by an interrupt service routine.

FIG. 6 illustrates a flowchart depicting steps taken to practice an exemplary embodiment of an interrupt service routine (ISR) generated in the aforementioned step 520 of FIG. 5. An ISR generated in the aforementioned step may attach an interrupt to its associated task function, and may be executed when hardware interrupt block 128 receives an interrupt that the hardware interrupt block is configured to handle.

In step 600, the ISR may disable preemption of the current asynchronous interrupt by other asynchronous interrupts by imposing a lock or may allow preemption. If the preemption flag associated with the current asynchronous interrupt is set to '0,' reception of further asynchronous interrupts may be blocked during execution of the interrupt service routine. In this scenario, other asynchronous interrupts, even those of higher task priorities, may not preempt the current asynchronous interrupt, and the current interrupt service routine may not be placed on hold. On the other hand, if the preemption flag is set to '1,' reception of further asynchronous interrupts may be left enabled. In this scenario, other asynchronous interrupts of higher task priorities may preempt the current asynchronous interrupt, and the current interrupt service routine may be placed on hold for the execution of the interrupt service routines of the higher-priority interrupts.

In step 610, the ISR may save the original configuration of hardware context. The ISR may save all hardware registers that may change during execution of the ISR task.

In step 620, the ISR may set a new configuration of hardware for the duration of the execution of the ISR. This new configuration may allow hardware interrupt block 128 to implement hardware interrupt prioritization. In an exemplary embodiment, the ISR may disable asynchronous interrupts with task priorities equal to or lower than that of the asynchronous interrupt associated with the ISR. As a result, during execution of the current ISR, hardware interrupt block 128 may not receive or handle asynchronous interrupts of equal or lower priority. In the same embodiment, the ISR may enable asynchronous interrupts with task priorities higher than that of the asynchronous interrupt associated with the ISR. As a result, during execution of the current ISR, hardware interrupt block 128 may receive and handle asynchronous interrupts of higher priority. This technique of enabling higher-priority asynchronous interrupts and disabling equal-priority and lower-priority asynchronous interrupts in step 620 may allow hardware interrupt block 128 to maintain a prioritization scheme. Another embodiment of the ISR may separate the tasks of enabling interrupts and disabling interrupts into two different steps. Yet another embodiment may combine steps 600 and 620 to set a new configuration of hardware interrupt block 128 based both on task priorities and the preemption flag of the current asynchronous interrupt.

In one embodiment, a later-arriving lower or equal-priority interrupt may have to wait for the completion of the servicing of a higher-priority interrupt. In another embodiment, servicing of such a higher-priority interrupt may be suspended after a given time, after which time later-arriving interrupts may be serviced.

In step 630, the ISR may call the task function that is to be executed in response to the asynchronous interrupt associated with the ISR.

In step 640, the ISR may perform the step of restoring the original configuration of hardware context so that hardware interrupt block 128 is ready to respond to further asynchronous interrupts. The ISR may set the configuration of hardware context to the configuration saved in step 610, and may enable all asynchronous interrupts that were configured by the user.

In step 650, the ISR may perform the final step of removing the lock on preemption if a lock was imposed in step 600. As a result, all asynchronous interrupts may be enabled.

An example helps to illustrate exemplary embodiments. Consider the model depicted in FIG. 3. Block diagram model 300, illustrated in FIG. 3, models an embedded system, and includes hardware device blocks 302, 304 and 306 and function-call subsystems 340, 360 and 380. Block diagram model 300 further includes hardware interrupt block 128 and demux block 320.

Three hardware blocks generate asynchronous interrupts for asynchronous processing in block diagram model 300: c281x Serial Communications Interface (SCI) receive block 302, analog-digital converter (ADC) block 304, and c281x enhanced Controller Area Network (eCAN) receive block 306. Each hardware interrupt generating block is identified by two numbers: the central processing unit (CPU) interrupt number and peripheral interrupt extension (PIE) interrupt number. The aforementioned numbers for block 302 are 1 and 11, for block 304 are 1 and 21, and for block 306 are 5 and 15, respectively.

In response to asynchronous interrupts from c281x SCI receive block 302, c281 SCI transmit subsystem 340 is executed to transmit the received message to another address. In response to asynchronous interrupts from ADC block 304, timer subsystem 360 is executed to reset a timer. In response to asynchronous interrupts from c281x eCAN receive block 306, light-emitting diode (LED) control subsystem 380 is executed to indicate the receipt of a message at the eCAN mailbox.

Computations performed by blocks 302 and 304 are essential to the real-time execution of block diagram model 300, and thus, output signals of blocks 302 and 304 (in the form of asynchronous interrupts) require immediate handling. In contrast, eCAN receive block 306 is not essential for real-time simulation since it controls an external LED, and output signals of block 306 (in the form of asynchronous interrupts) do not require immediate handling. The order of asynchronous interrupt priority for asynchronous interrupt sources in block diagram model 300 should be: block 302, block 304, block 306.

Figure 7A:
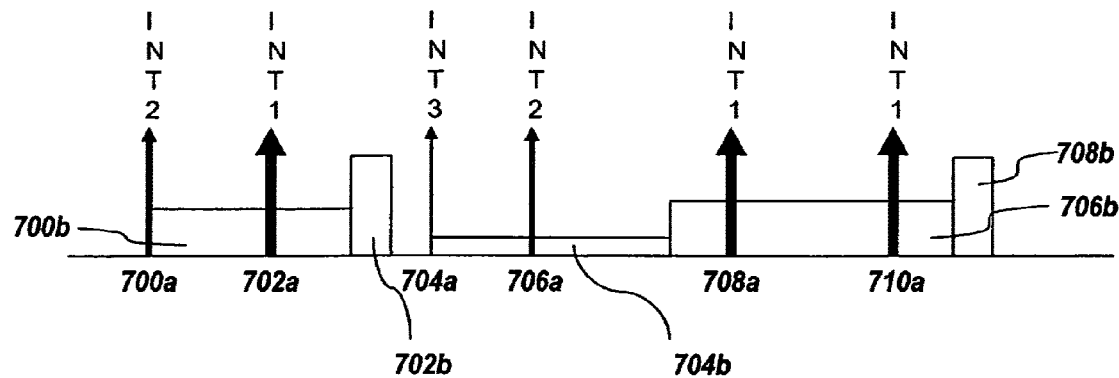
FIG. 7A illustrates an exemplary task schedule that uses only hardware-supported prioritization.

FIG. 7A illustrates an exemplary task schedule that uses only hardware-supported prioritization, and highlights the need for exemplary embodiments for real-time execution. The thickness of an interrupt arrow is proportional to the task priority of the asynchronous interrupt. Highest-priority asynchronous interrupts from block 302 of type INT1, are depicted by the thickest arrows. Medium-priority asynchronous interrupts from block 304 of type INT2, are depicted by the arrows of medium thickness. Lowest-priority asynchronous interrupts from block 306 of type INT3, are depicted by the thinnest arrows.

In the scenario depicted in FIG. 7A, asynchronous interrupt prioritization is not implemented in software. Hardware interrupt block 128 and demux block 320 are non-existent in block diagram model 300, or are non-functional. However, block diagram model 300 is able to execute the appropriate task functions in response to asynchronous interrupts from blocks 302, 304 and 306, only not according to a desired schedule. In the task schedule in FIG. 7A, block 304 first generates asynchronous interrupt 700a of type INT2. In response, the block diagram model executes INT2 ISR 700b. During the execution of task function 700b, block 302 generates asynchronous interrupt 702a of type INT1. Higher-priority INT1 interrupt 702a should ideally preempt INT2 ISR 700b (i.e. stop the execution of INT2 ISR 700b and start execution of INT1 ISR 702b). However, since no asynchronous interrupt prioritization scheme is implemented in the software, execution of INT1 ISR 702b begins in response to interrupt 702a only after execution of the previous INT2 ISR 700b has ended. In this case, it is essential in real-time execution to handle the higher-priority interrupt generated by the INT1 SCI block as quickly as possible. However, this handling has to wait for the handling of the lower-priority ADC block.

Block 306 then generates asynchronous interrupt 704a of type INT3. In response, INT3 ISR 704b is executed. During execution of INT3 ISR 704b, block 304 generates asynchronous interrupt 706a of type INT2. Interrupt 706a has higher priority than interrupt 704a, but is unable to preempt interrupt 704a because of the lack of a prioritization scheme implemented in software. As a result, execution of INT2 ISR 706b, in response to asynchronous interrupt 706a, can only begin after execution of INT3 ISR 704b has ended. While INT2 ISR 706b is being executed, block 302 generates asynchronous interrupt 708a. Despite being a higher-priority interrupt, asynchronous interrupt 708a cannot preempt task function 706b. Execution of task function 708b, in response to asynchronous interrupt 708a, can only begin after execution of task function 706b has ended. During execution of task function 706b, block 302 generates another asynchronous interrupt 710a. However, execution of a task function in response to asynchronous interrupt 710a does not even begin within the timeframe of this task schedule, and is therefore not pictured in the figure.

The scenario depicted in the aforementioned task schedule is undesirable in real-time execution of a model. Exemplary embodiments may employ a prioritization scheme to ensure that high-priority interrupts are handled as quickly as possible. An exemplary embodiment uses hardware interrupt block 128 and demux block 320, pictured in FIG. 3. A description of the handling of the foregoing scenario in FIG. 7B by the exemplary embodiment follows.

First, the user configures hardware interrupt block 128 to accept and prioritize asynchronous interrupts from the following source identifiers (CPU interrupt number, PIE interrupt number) corresponding to blocks 302, 304 and 306: (1, 11), (1, 21) and (5, 15), respectively. Second, the user designates task priorities to the aforementioned sources. In this embodiment, a higher task priority number denotes a higher priority. Source identifiers (1, 11), (1, 21) and (5, 15) are designated task priorities of 60, 50 and 10, respectively. It is worth mentioning that synchronous interrupts are designated a task priority of 40 in block diagram model 300. Thus, the order of task priorities, in descending priority, is: block 302 (type INT1), block 304 (type INT2), synchronous interrupts, and block 306 (type INT3). Third, the user sets the preemption flags to '1,' thus specifying that all asynchronous interrupts are preemptable.

Hardware interrupt block 128 receives the aforementioned settings from the user and generates three interrupt services routines: ISR 800 associated with INT1, ISR 820 associated with INT2, and ISR 840 associated with INT3. Descriptions of exemplary embodiments of the ISRs follow.

Figure 8A:
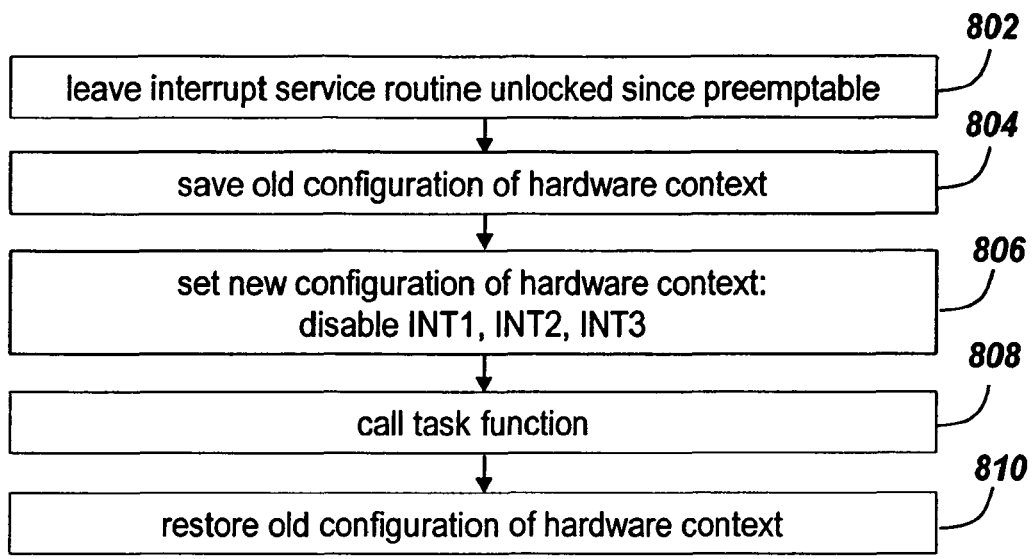
FIG. 8A illustrates a flowchart depicting steps performed by an interrupt service routine for a highest-priority asynchronous interrupt.

FIG. 8A illustrates a flowchart depicting steps taken to practice ISR 800 in response to highest-priority asynchronous interrupts of type INT1 generated by block 302. In step 802, ISR 800 leaves itself unlocked in order to be preemptable, thus allowing reception of all interrupts. In step 806, ISR 800 sets the new configuration of hardware by disabling all lower or equal-priority asynchronous interrupts: INT1, INT2 and INT3. This step ensures that the implementation considers asynchronous interrupts generated by block 302 as highest-priority, i.e. does not place INT1 interrupts on hold to service other INT1, INT2 or INT3 interrupts. In one embodiment, synchronous interrupts of lower or equal priority may be disabled in step 806. In another embodiment, synchronous interrupts of lower or equal priority may be left enabled in step 806.

Figure 8B:
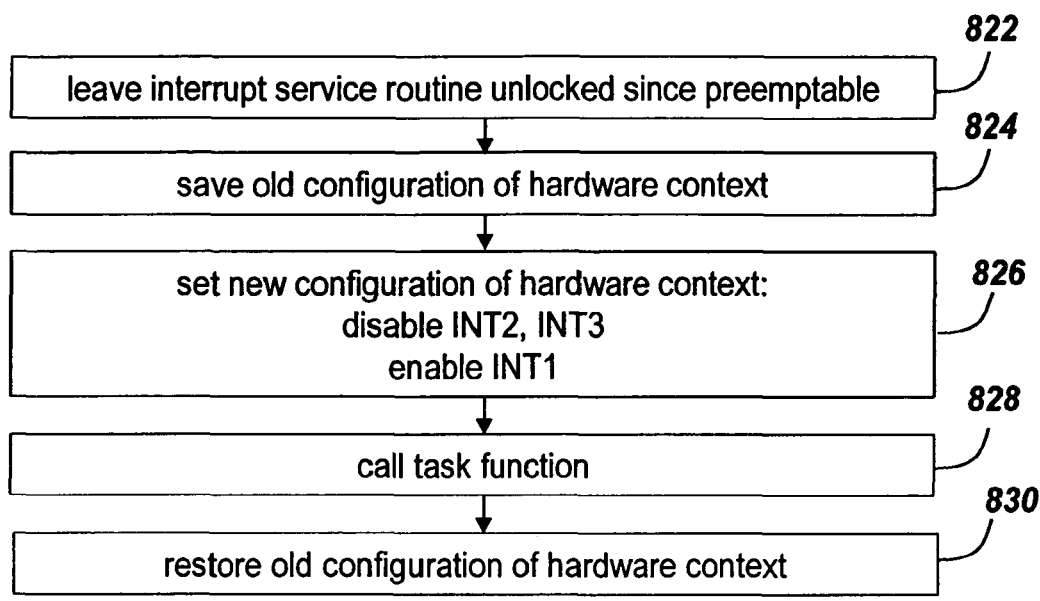
FIG. 8B illustrates a flowchart depicting steps performed by an interrupt service routine for a medium-priority asynchronous interrupt.

FIG. 8B illustrates a flowchart depicting steps taken to practice ISR 820 in response to medium-priority asynchronous interrupts of type INT2 generated by block 304. In step 822, ISR 820 leaves itself unlocked in order to be preemptable, thus allowing reception of all interrupts. In step 826, ISR 820 sets the new configuration of hardware by disabling lower or equal-priority asynchronous interrupts INT2 and INT3, and enabling higher-priority asynchronous interrupt INT1. This step ensures that the implementation considers asynchronous interrupts generated by block 304 as medium-priority: i.e. does not place INT2 interrupts on hold to service INT2 or INT3 interrupts, but places INT2 interrupts on hold to service INT1 interrupts. In one embodiment, synchronous interrupts of lower or equal priority may be disabled in step 826. In another embodiment, synchronous interrupts of lower or equal priority may be left enabled in step 826.

Figure 8C:
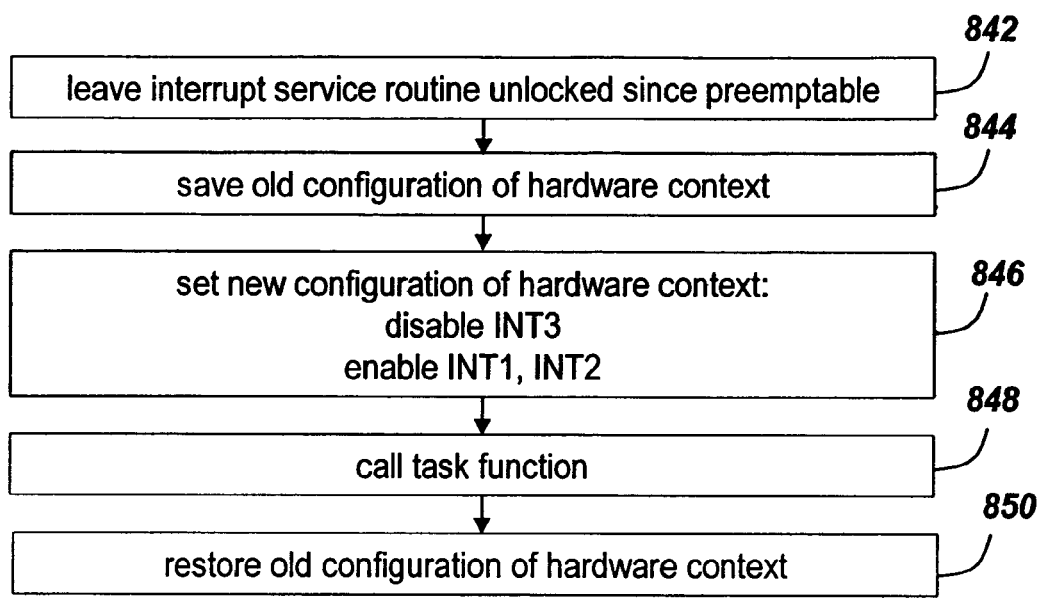
FIG. 8C illustrates a flowchart depicting steps performed by an interrupt service routine for a lowest-priority asynchronous interrupt.

FIG. 8C illustrates a flowchart depicting steps taken to practice ISR 840 in response to lowest-priority asynchronous interrupts of type INT3 generated by block 306. In step 842, ISR 840 leaves itself unlocked in order to be preemptable, thus allowing reception of all interrupts. In step 846, ISR 840 sets the new configuration of hardware by enabling higher-priority asynchronous interrupts INT1 and INT2, and disabling equal-priority interrupt INT3. This step ensures that the implementation considers asynchronous interrupts generated by block 306 as lowest-priority: i.e. does not place INT3 interrupts on hold to service other INT3 interrupts, but places INT3 interrupts on hold to service INT1 or INT2 interrupts. In one embodiment, synchronous interrupts of lower or equal priority may be disabled in step 846. In another embodiment, synchronous interrupts of lower or equal priority may be left enabled in step 846.

Figure 7B:
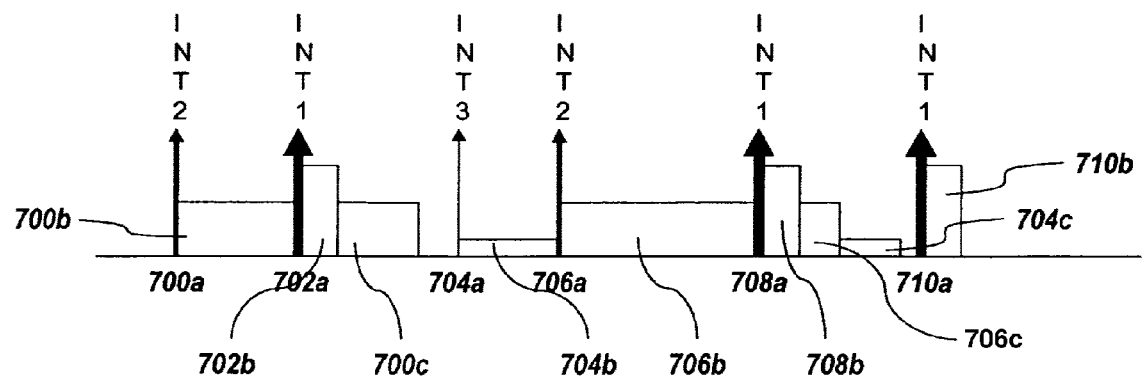
FIG. 7B illustrates an exemplary task schedule that uses software prioritization.

The task schedule depicted in FIG. 7B is generated as follows. Block 304 generates INT2 asynchronous interrupt 700a. In response, hardware interrupt block 128 dispatches to the INT2 ISR 820, this execution of the INT2 ISR being referred to as 700b. The INT2 ISR enables and may be interrupted by INT1 asynchronous interrupts. During execution of INT2 ISR 700b, block 302 generates INT1 asynchronous interrupt 702a. In response, hardware interrupt block 128 places ISR 700b on hold and dispatches to the INT1 ISR 800, this execution of the INT1 ISR being referred to as 702b. After the execution of the INT1 ISR 702b is completed, 700c, the remaining portion of INT2 ISR 700b, executes.

After asynchronous interrupts 700a and 702a have been handled, i.e. after their associated ISRs have executed completely, block 306 generates INT3 asynchronous interrupt 704a. In response, hardware interrupt block 128 dispatches to INT3 ISR 840, this execution of the INT3 ISR being referred to as 704b. The INT3 ISR enables and may be interrupted by higher-priority asynchronous interrupts INT1 and INT2. During execution of INT3 ISR 704b, block 304 generates INT2 asynchronous interrupt 706a. In response, hardware interrupt block 128 places INT3 ISR 704b on hold and dispatches to the INT2 ISR 820, this execution of the INT2 ISR being referred to as 706b. The INT2 ISR 820 enables and may be interrupted by higher-priority asynchronous interrupt INT1. During execution of INT2 ISR 706b, block 302 generates INT1 asynchronous interrupt 708a. In response, hardware interrupt block 128 places INT2 ISR 706b on hold and dispatches to INT1 ISR 800, this execution of the INT1 ISR being referred to as 708b. The INT1 ISR does not enable any asynchronous interrupts and therefore runs uninterrupted.

After the execution of INT1 ISR 708b is complete, 706c, the remaining portion of the INT2 ISR 706b, executes. After the execution of INT2 ISR 706c is complete, 704c, the remaining portion of the INT3 ISR 704b, executes.

After asynchronous interrupts 704a, 706a and 708a have been handled, i.e. after the executions of their associated ISRs are complete, block 302 generates INT1 asynchronous interrupt 710a. In response, hardware interrupt block 128 dispatches INT1 ISR 800, this execution of the INT1 ISR being referred to as 710b. No further asynchronous interrupts arrive, and 710a is handled within the timeframe of the task schedule.

In contrast to the task schedule depicted in FIG. 7A, the task schedule in FIG. 7B shows interrupt prioritization implemented in software. Lower-priority interrupts are placed on hold for the handling of higher-priority interrupts, a technique that supports the real-time response of the block diagram model to hardware events.

Implementations may provide for automatic prioritization of asynchronous interrupts in a modeling environment, such as a block diagram modeling environment. Based on the application requirements, associated task functions of the asynchronous interrupts may be assigned priorities of execution. An interrupt is expected to be preempted by higher-priority interrupts, but not by equal-priority or lower-priority interrupts. Implementations may achieve asynchronous interrupt prioritization by automatically generating code to honor the task priorities assigned to each interrupt source in the model.

The foregoing description of exemplary embodiments provides illustration and description, but is not intended to be exhaustive or to limit the implementation to the precise form disclosed. Modifications and variations are possible in light of the above teachings or may be acquired from practice of the implementation. Although the discussion contained herein has been made with reference to graphical models, it will be appreciated that the techniques discussed above may also be utilized for non-graphical models, e.g. textual models.

The prioritization scheme in exemplary embodiments may be available to an external model developer through an Application Programming Interface (API). In one embodiment, the API may be implemented as a block in the model. In other embodiments, the API may be implemented as a set of controls, dialogs, settings, etc.

Code for exemplary embodiments may be provided as one or more computer-readable programs embodied on or in one or more mediums operating alone or in combination. The mediums may be a floppy disk, a hard disk, a compact disc, a digital versatile disc, a flash memory card, a PROM, a RAM, a ROM, a magnetic tape, or a field programmable gate array (FPGA). In general, the computer-readable programs may be implemented in any programming language. Some examples of languages that can be used include MATLAB, C, C++, C#, JAVA, Javascript, or a hardware description language (HDL). The software programs may be stored on or in one or more mediums as object code.

Further, certain portions of the implementation may be implemented as "logic" that performs one or more functions. This logic may include hardware, such as hardwired logic, an application-specific integrated circuit, a field programmable gate array, a microprocessor, software, wetware, or a combination of hardware and software.

Since certain changes may be made without departing from the scope of the present implementation, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present implementation and that the illustrations contained herein are singular examples of a multitude of possible depictions of the present implementation.

The scope of the implementation is defined by the claims and their equivalents.

We claim:

1. A method comprising:
    receiving information associated with asynchronous interrupts in a block diagram model that models behavior of a dynamic system when executed,
        the block diagram model including blocks that represent each represent a hardware device or subsystem,
            the blocks being interconnected by lines that represent signals,
                the signals corresponding to time-varying quantities and representing inputs and outputs of the dynamic system,
        the asynchronous interrupts being generated by the blocks in the block diagram model,
        the information associated with the asynchronous interrupts including:
            information associated with a first interrupt and a second interrupt, and
            information associated with priorities of the asynchronous interrupts,
        a target system being configured to process the asynchronous interrupts,
        the target system being configured to service the first interrupt and the second interrupt via a non-prioritized interrupt handling method, and
        the receiving the information associated with the asynchronous interrupts being performed by a device;
    assigning, based on the information associated with the priorities of the asynchronous interrupts, a first priority to the first interrupt,
        the assigning the first priority being performed by the device;
    assigning, based on the information associated with the priorities of the asynchronous interrupts, a second priority to the second interrupt,
        the second priority being higher than the first priority, and
        the assigning the second priority being performed by the device;
    generating, based on the first priority and the second priority, code that, when executed on the target system, causes the target system to place servicing the first interrupt on hold upon receiving the second interrupt,
        the generating the code being performed by the device; and
    causing the target system to execute the code,
        the causing the target system to execute the code being performed by the device,
        the code including an interrupt service routine (ISR) for the first interrupt,
        the code, when executed on the target system, causing the target system to execute the ISR based on receiving the first interrupt, and
        the ISR causing the target system to:
            store information associated with an original hardware configuration for the blocks,
            set a new hardware configuration, for the blocks, that allows implementing an interrupt prioritization based on the first priority,
            call a task that corresponds to the first interrupt, and
            restore the original hardware configuration, for the blocks, based on the information associated with the original hardware configuration.

2. The method of claim 1, where the ISR causes the target system to:
    receive the first interrupt;
    start servicing of the first interrupt;

receive the second interrupt;
place the servicing of the first interrupt on hold; and
start servicing of the second interrupt.

3. The method of claim 2, where the ISR causes the target system to resume the servicing of the first interrupt after completing the servicing of the second interrupt.

4. The method of claim 2, further comprising:
assigning a third priority to a third interrupt,
the third priority being lower than the first priority,
the ISR causing the target system to:
receive the third interrupt after starting the servicing of the first interrupt, and
place servicing of the third interrupt on hold.

5. The method of claim 4, where the ISR causes the target system to start the servicing of the third interrupt upon completing the servicing of the first interrupt.

6. The method of claim 4, where the ISR causes the target system to start the servicing of the third interrupt a preset time after starting the servicing of the first interrupt.

7. The method of claim 1, further comprising:
receiving information using an interface; and
assigning the first priority or the second priority based on the information received using the interface.

8. The method of claim 1, where:
the first priority is determined based on a priority of a first task associated with the first interrupt, and
the second priority is determined based on a priority of a second task associated with the second interrupt.

9. A system comprising:
one or more processors to:
receive information associated with asynchronous interrupts in a block diagram model that models behavior of a dynamic system when executed,
the block diagram model including blocks that each represent a hardware device or subsystem,
the blocks being interconnected by lines that represent signals,
the signals corresponding to time-varying quantities and representing inputs and outputs of the dynamic system,
the asynchronous interrupts being generated by the blocks in the block diagram model,
the information associated with the asynchronous interrupts including:
information associated with a first interrupt and a second interrupt, and
information associated with priorities of the asynchronous interrupts,
a target system being configured to process the asynchronous interrupts, and
the target system being configured to service the first interrupt and the second interrupt via a non-prioritized interrupt handling method;
assign, based on the information associated with the priorities of the asynchronous interrupts, a first priority to the first interrupt;
assign, based on the information associated with the priorities of the asynchronous interrupts, a second priority to the second interrupt,
the second priority being higher than the first priority;
generate, based on the first priority and the second priority, code that, when executed on the target system, causes the target system to place servicing the first interrupt on hold upon receiving the second interrupt; and
cause the target system to execute the code,
the code including an interrupt service routine (ISR) for the first interrupt,
the code, when executed on the target system, causing the target system to execute the ISR based on receiving the first interrupt, and
the ISR causing the target system to:
store information associated with an original hardware configuration for the blocks,
set a new hardware configuration, for the blocks, that allows implementing an interrupt prioritization based on the first priority,
call a task that corresponds to the first interrupt, and
restore the original hardware configuration, for the blocks, based on the information associated with the original hardware configuration.

10. The system of claim 9, where the one or more processors are further to:
upon starting servicing of the first interrupt, disable servicing of interrupts with priorities lower than or equal to the first priority; and
enable servicing of interrupts with priorities higher than the first priority.

11. The method of claim 1, where storing the information associated with the original hardware configuration includes storing information associated with one or more hardware registers.

12. The method of claim 1, where the ISR causes the target system to:
enable the second interrupt; and
disable a third interrupt to which a third priority is assigned,
the third priority being lower than the first priority.

13. The method of claim 12, where the ISR causes the target system to:
disable a fourth interrupt to which a fourth priority is assigned,
the fourth priority being equal to the first priority.

14. The method of claim 1, where:
the ISR is a first ISR;
the code includes a second ISR for the second interrupt; and
the code, when executed on the target system, causes the target system to execute the second ISR based on receiving the second interrupt.

15. The method of claim 14, where the second ISR causes the target system to:
store information associated with a second original hardware configuration for the blocks;
set a second new hardware configuration, for the blocks, that allows implementing a second interrupt prioritization based on the second priority;
call a second task that corresponds to the second interrupt; and
restore the second original hardware configuration, for the blocks, based on the information associated with the second original hardware configuration.

16. The method of claim 14, where:
the second interrupt is non-preemptable; and
the second ISR causes the target system to disable preemption of the second interrupt.

17. The method of claim 1, further comprising:
receiving information associated with how the code is to be executed by the target system for the asynchronous interrupts,
the information associated with how the code is to be executed by the target system including:

the information associated with the original hardware configuration for the blocks, and
information associated with the new hardware configuration for the blocks; and
generating the code based on the information associated with how the code is to be executed by the target system for the asynchronous interrupts.

18. The method of claim 1, further comprising:
receiving parameters that cause the target system to handle the asynchronous interrupts in a manner set forth in the block diagram model,
the parameters including a parameter that specifies an interrupt number for a processor of the target system; and
generating the code based on the parameters.

19. The system of claim 9, where storing the information associated with the original hardware configuration includes storing information associated with one or more hardware registers.

20. The system of claim 9, where the ISR causes the target system to:
enable the second interrupt; and
disable a third interrupt to which a third priority is assigned,
the third priority being lower than the first priority.

21. The system of claim 9, where the ISR causes the target system to:
disable a fourth interrupt to which a fourth priority is assigned,
the fourth priority being equal to the first priority.

22. The system of claim 9, where:
the ISR is a first ISR;
the code includes a second ISR for the second interrupt; and
the code, when executed on the target system, causes the target system to execute the second ISR based on receiving the second interrupt.

23. The system of claim 22, where the second ISR causes the target system to:
store information associated with a second original hardware configuration of for the blocks;
set a second new hardware configuration, for the blocks, that allows implementing a second interrupt prioritization based on the second priority;
call a second task that corresponds to the second interrupt; and
restore the second original hardware configuration, for the blocks, based on the information associated with the second original hardware configuration.

24. A non-transitory computer-readable medium storing instructions, the instructions comprising:
one or more instructions that, when executed by one or more processors of a device, cause the one or more processors to:
receive information associated with asynchronous interrupts in a block diagram model that models behavior of a dynamic system when executed,
the block diagram model including blocks that each represent a hardware device or subsystem,
the blocks being interconnected by lines that represent signals,
the signals corresponding to time-varying quantities and
representing inputs and outputs of the dynamic system,
the asynchronous interrupts being generated by the blocks in the block diagram model,
the information associated with the asynchronous interrupts including:
information associated with a first interrupt and a second interrupt, and
information associated with priorities of the asynchronous interrupts,
a target system being configured to process the asynchronous interrupts, and
the target system being configured to service the first interrupt and the second interrupt via a non-prioritized interrupt handling method;
assign, based on the information associated with the priorities of the asynchronous interrupts, a first priority to the first interrupt;
assign, based on the information associated with the priorities of the asynchronous interrupts, a second priority to the second interrupt,
the second priority being higher than the first priority;
generate, based on the first priority and the second priority, code that, when executed on the target system, causes the target system to place servicing the first interrupt on hold upon receiving the second interrupt; and
cause the target system to execute the code,
the code including an interrupt service routine (ISR) for the first interrupt,
the code, when executed on the target system, causing the target system to execute the ISR based on receiving the first interrupt, and
the ISR causing the target system to:
store information associated with an original hardware configuration for the blocks,
set a new hardware configuration, for the blocks, that allows implementing an interrupt prioritization based on the first priority,
call a task that corresponds to the first interrupt, and
restore the original hardware configuration, for the blocks, based on the information associated with the original hardware configuration.

* * * * *